(12) United States Patent
Naimi et al.

(10) Patent No.: US 7,505,283 B2
(45) Date of Patent: Mar. 17, 2009

(54) REINFORCING STRUCTURE FOR METAL CORE BOARD AND ELECTRIC CONNECTION BOX

(75) Inventors: Fumikazu Naimi, Chiyoda-ku (JP); Masami Takase, Chiyoda-ku (JP); Akihisa Watanabe, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/864,065

(22) Filed: Sep. 28, 2007

(65) Prior Publication Data

US 2008/0089037 A1 Apr. 17, 2008

Related U.S. Application Data

(63) Continuation of application No. PCT/JP2006/305970, filed on Mar. 24, 2006.

(30) Foreign Application Priority Data

Mar. 28, 2005 (JP) .............................. 2005-092958

(51) Int. Cl.
*H05K 1/18* (2006.01)
(52) U.S. Cl. ........................................ 361/761; 174/50
(58) Field of Classification Search .................. 174/50, 174/520, 535, 559, 17 R; 361/728, 761
See application file for complete search history.

(56) References Cited

U.S. PATENT DOCUMENTS

| 6,870,096 | B2 * | 3/2005 | Suzuki et al. | 174/50 |
| 7,189,081 | B2 * | 3/2007 | Tanaka et al. | 439/76.2 |
| 7,320,608 | B2 * | 1/2008 | Kubota et al. | 439/76.1 |
| 2007/0279871 | A1 * | 12/2007 | Ishida et al. | 361/704 |

FOREIGN PATENT DOCUMENTS

| JP | 2-58384 | | 4/1990 |
| JP | 2-163988 | | 6/1990 |
| JP | 2-104691 | | 8/1990 |
| JP | 4-105592 | | 9/1992 |
| JP | 7-321421 | | 12/1995 |
| JP | 8-97578 | | 4/1996 |
| JP | 8-1371 | | 9/1996 |
| JP | 2001119838 | * | 4/2001 |
| JP | 2001-237572 | | 8/2001 |
| JP | 2003-87936 | | 3/2003 |
| JP | 2004-72881 | | 3/2004 |

\* cited by examiner

*Primary Examiner*—Dean A. Reichard
*Assistant Examiner*—Yuriy Semenenko
(74) *Attorney, Agent, or Firm*—Oblon, Spivak, McClelland, Maier & Neustadt, P.C.

(57) ABSTRACT

The metal-core-board reinforcing structure has a metal core board having a metal core and a resin plate having substantially the same extent as that of the metal core board and being fixedly attached to the metal core board substantially parallel to one side of the metal core board and spaced apart therefrom by a predetermined distance.

9 Claims, 11 Drawing Sheets

REINFORCING STRUCTURE FOR METAL CORE BOARD AND ELECTRIC CONNECTION BOX

TECHNICAL FIELD

The present invention relates to a reinforcing structure for metal core board and an electric connection box.

BACKGROUND ART

In recent years, an electric connection box using a metal core board which is excellent in heat radiation has been proposed in response to various requirements in the field of motorcar such as miniaturization, increase in the amount of electric current used, simplification of design change and so on.

The metal core board is a printed circuit board having at least one internal metal core which is made of metal such as copper or aluminum.

Generally, the soaking in the metal core board is improved as the thickness of the metal core board increases. On the other hand, the electric connection box for motorcar is requested to be formed as thin as possible for providing the soaking effect to the board while reinforcing the board since its weight and strength can be concerned.

In the past, there have been proposed various techniques for reinforcing printed circuit boards used in the electric connection boxes.

For example, Japanese Laid-Open Patent Publication No. 2001-237572 discloses a reinforcing structure in which a printed circuit board is supported on a support member in a housing through a reinforcing member (which will be referred to as the related art 1).

Japanese Laid-Open Patent Publication No. 2004-72881 discloses a structure in which a heat radiating plate is sandwiched between two metal core boards (which will be referred to as the related art 2).

Japanese Laid-Open Patent Publication Hei 7-321421 discloses a structure in which a reinforcing material is applied to a flexible printed circuit board (which will be referred to as the related art 3).

There is furthermore need for installing more boards in an electric connection box in response to the increased number of electrical and electronic parts in the motorcar.

However, the electric connection box according to the related art comprises a metal core board disposed horizontally relative to an upper or lower casing portion by fastening it to the casing through screws or the like at the corners of the board (at four corners in a square board) so that the desired strength of the metal core board is secured. In such a case, the total number of two boards, one on the upper casing portion and one on the lower casing portion, can be disposed in the electric connection box at the best. This technique will be referred to as the related art 4.

Patent Document 1:
Japanese Laid-Open Patent Publication No. 2001-237572 bulletin
Patent Document 2:
Japanese Laid-Open Patent Publication No. 2004-72881 bulletin
Patent Document 3:
Japanese Laid-Open Patent Publication Hei 7-321421 bulletin The related art 1 raises a problem in that the size of the device is increased in a direction perpendicular to the plane of the printed circuit board since the reinforcing members are attached to the printed circuit board at the opposite ends thereof.

The related art 2 raises another problem in that it is difficult to reduce the weight of the reinforcing structure since the metallic heat radiating plate itself is heavy.

The related art 2 raises still another problem in that the connections for connecting the heat radiating plate to a vehicle body or the like extend outwardly from the main body of the heat radiating plate. This is disadvantageous to reduction of the size.

The related art 3 raises a further problem in that the heat radiation in the flexible printed circuit board cannot be secured since the flexible printed circuit board is applied to the reinforcing member.

The related art 4 raises a further problem in that the number of boards which can be disposed in the casing is limited since the board is disposed horizontally relative to the casing.

Therefore, the space within the casing cannot be used effectively.

SUMMARY OF THE INVENTION

The present invention provides a first reinforcing structure for metal core board, characterized by that it comprises a metal core board having a metal core and a resin plate having substantially the same extent as that of the metal core board and being fastened to the metal core board substantially parallel to one side of the metal core board and spaced apart therefrom by a predetermined distance.

The present invention provides a second reinforcing structure for metal core board, characterized by that it comprises a first metal core board having a metal core, a second metal core board having a metal core and a resin plate disposed between the first and second metal core boards, the first and second core boards and the resin plate having substantially the same extent, the resin plate being fastened to the first metal core board substantially parallel to one side of the first metal core board and spaced apart therefrom by a predetermined first distance and also being fastened to the second metal core board substantially parallel to one side of the second metal core board and spaced apart therefrom by a predetermined second distance.

The first and second metal core boards may be electrically connected to each other through a fuse. The first and second distances may be defined for the width of the fuse.

The resin plate may have a function of shielding electromagnetic waves.

The present invention further provides an electric connection box characterized by that it comprises a board assembly including the aforementioned reinforcing structure for metal core board and a casing for fixedly receiving the board assembly. The casing may be formed to extend in the horizontal direction. The board assembly may be disposed in a direction substantially perpendicular to the casing.

The reinforcing structure for metal core board according to the present invention provides the following advantages:

(1) Since the electric connection box has a resin plate having substantially the same extend as that of the metal core board and being disposed substantially parallel to the metal core board, it can be mechanically reinforced while securing space saving.

(2) The electric connection box can be reduced in weight and size since it uses a resin plate having substantially the same extend as that of the metal core board.

(3) Since the resin plate body is spaced apart from the metal core board by a predetermined distance, heat can escape into a space between the metal core board and the resin plate. This can improve the heat radiation from the metal core board.

The electric connection box of the present invention can secure the strength of the metal core board since the board assembly having the reinforcing structure for metal core board is fixedly received by the casing. In this electric connection box, the board can be disposed substantially in the vertical direction relative to the casing in addition to the horizontal direction. As a result, the metal core board can be disposed within the casing in any desired position. The desired number of metal core boards having the desired shapes and sizes can be disposed within the casing. Therefore, the space within the casing can be used more effectively.

BRIEF DESCRIPTION OF THE DRAWINGS

FIG. 9 shows an electric connection box according to the fifth embodiment of the present invention.

FIG. 11 shows an electric connection box according to the sixth embodiment of the present invention.

EXPLANATION OF REFERENCE NUMERALS

1: Metal Core Board
2: Resin Plate
3: Relays
4: Fuse Terminals
5: Electronic Components
6: Threaded Stubs
7: Positioning Pins
8: Screws
9: First Metal Core Board
10: Second Metal Core Board
11: Resin Plate
12: First Threaded Stubs
13: Second Threaded Stubs
14: Bus Bar
15: Terminal Holders
16: Fuse
17: Resin Plate
17a: Electromagnetic Wave Absorbing Sheet
17b: Metal Braid
18: Ground
19: Electric Connection Box
20: Upper Casing Portion
21: Lower Casing Portion
22: Casing
23: First Board Assembly
24: Fuse Terminal Holders
25: Connector Terminals
26: Connector Terminal Holders
27: Screws
28: Second Board Assembly
29: Electric Connection Box

DETAILED DESCRIPTION

Several embodiments of the present invention will now be described in reference to the accompanying drawings.

First Embodiment

Figure 1:
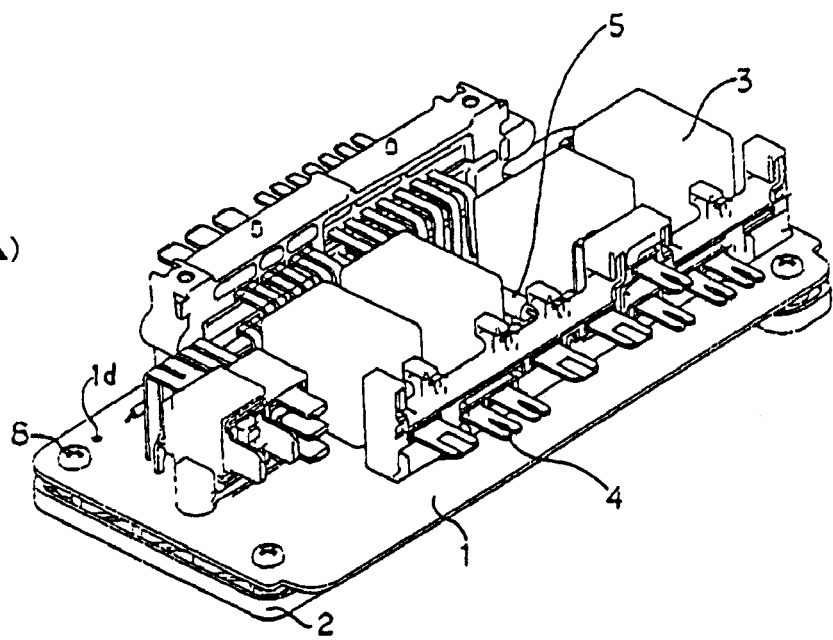
FIG. 1(A) is a perspective view showing a reinforcing structure for metal core board according to the first embodiment of the present invention.
FIG. 1(B) is a side view of FIG. 1(A) and FIG. 1(C) is a front view of FIG. 1(A).
Figure 1:
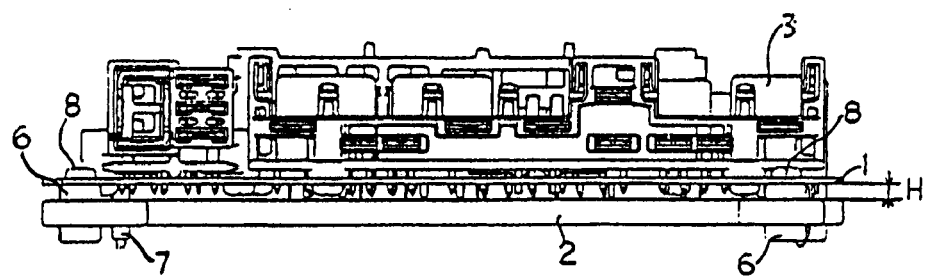
Figure 1:
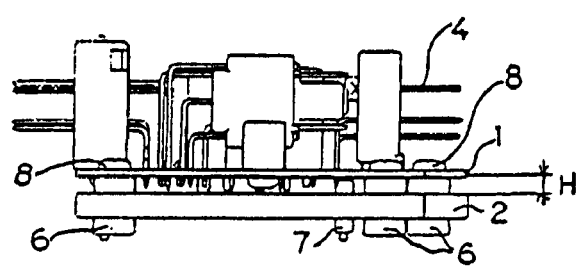
Figure 2:
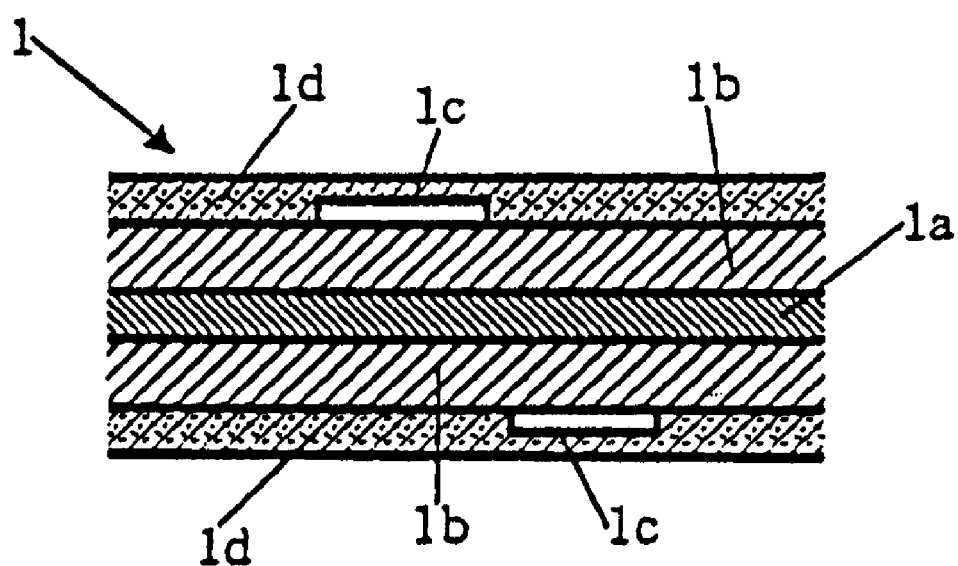
FIG. 2 is a cross-sectional view showing the internal structure of the metal core board.
Figure 3A:
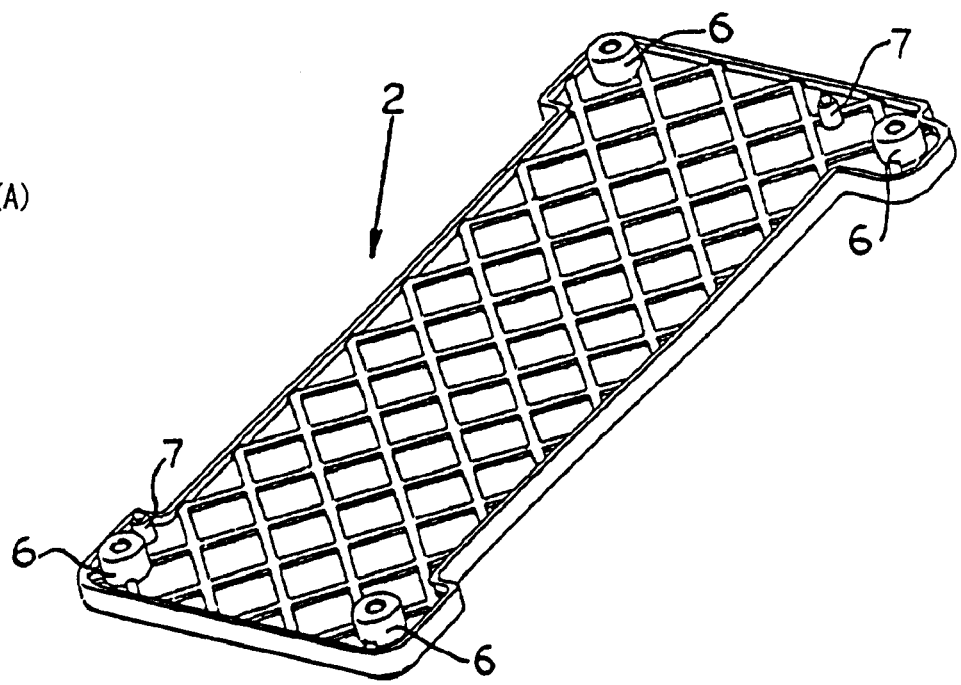
FIG. 3(A) is a perspective view of a resin plate.
Figure 3B:
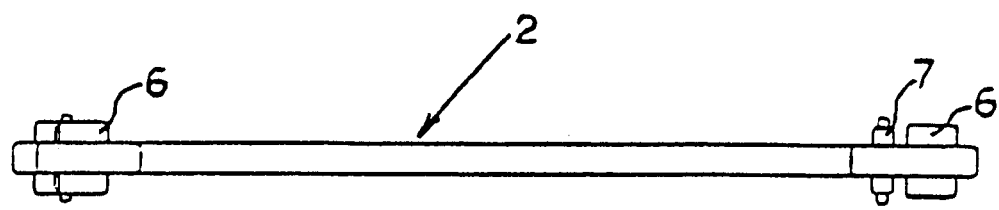
FIG. 3(B) is a side view of FIG. 3(A) and FIG. 3(C) is a front view of FIG. 3(A).
Figure 3C:
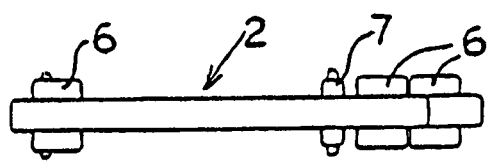

FIG. 1(A) is a perspective view showing a reinforcing structure for metal core board according to the first embodiment of the present invention; FIG. 1(B) is a side view of FIG. 1(A) and FIG. 1(C) is a front view of FIG. 1(A). FIG. 2 is a cross-sectional view showing the internal structure of the metal core board. FIG. 3(A) is a perspective view showing a resin plate; FIG. 3(B) is a side view of FIG. 3(A) and FIG. 3(C) is a front view of FIG. 3(A).

As shown in FIGS. 1(A)-(C), a reinforcing structure for metal core board (which will be referred to "metal-core-board reinforcing structure") according to the first embodiment of the present invention comprises a metal core board 1 of substantially rectangular configuration having an internal metal core, and a resin plate 2 having substantially the same extent as that of the metal core board 1 and being fastened to the metal core board 1 substantially parallel to the back side of the metal core board 1 and spaced apart therefrom by a predetermined distance.

The front side of metal core board 1 is provided with a plurality of relays 3, fuse terminals 4, various electronic components and others.

As shown in FIG. 2, the metal core board 1 includes a metal core (which will be referred to as "core portion") 1a formed of metal sheet, insulating layers 1b between which the core portion 1a is sandwiched, a conductive pattern circuit 1c formed on the surface of each of the insulating layers 1b, and a solder resist 1d for protecting each of the circuits 1c. The heat radiation is improved by conducting heat from the electronic circuits and parts on the board 1 to the core portion 1a.

The core portion 1a is made of highly conductive metal such as aluminum, aluminum alloy, copper, copper alloy or the like. The insulating layers 1b may be made of epoxy resin or the like.

As shown in FIGS. 3(A)-(C), the resin plate 2 is formed into substantially rectangular configuration and made of glass-reinforced polymer (e.g., Dow Plastic QUESTRA (trademark) WA212 available from Dow Chemical).

If the resin plate 2 is made of a resin material having substantially the same coefficient of thermal expansion as that of the core portion 1a in the metal core board 1, the influence of the thermal stress can be reduced to suppress solder cracks and the like.

The resin plate 2 includes four threaded stubs 6 formed therein at the four corners thereof and protruding from the resin plate 2 by a predetermined height. The threaded stubs 6 are used to fasten the resin plate 2 to the back side of the metal core board 1 through screws 8. The height of each of the threaded stubs is such selected that a predetermined spacing or distance H (see FIGS. 1(B) and (C)) is provided between the resin plate 2 and the metal core board 1 so that the resin plate 2 will not contact with the parts and solders on the back side of the metal core board 1.

The resin plate 2 also includes a plurality of positioning pins 7 (two in this illustrated embodiment) which are to be fitted into the corresponding positioning apertures 1d (see FIG. 1(A)) formed in the metal core board 1.

When it is wanted to assemble a reinforcing structure for reinforcing the metal core board 1 according to the first embodiment of the present invention, the positioning pins 7 in the resin plate 2 are first fitted into the respective positioning apertures 1d formed through the metal core board 1. Thus, the resin plate 2 is held substantially parallel to the metal core board 1 and spaced apart therefrom by a predetermined distance.

Subsequently, the screws 8 are inserted and screwed into the respective threaded stubs 6 of the resin plate 2 through the metal core board 1. Thus, the metal core board 1 is fixedly attached to the resin plate 2.

Since the reinforcing structure for the metal core board 1 according to the first embodiment of the present invention has the resin plate 2 having substantially the same extent as that of the metal core board 1 with the resin plate 2 being disposed substantially parallel to the back side of the metal core board 1, the electric connection box can be mechanically reinforced while securing space saving.

The electric connection box can be reduced in weight and size by using the resin plate having substantially the same extend as that of the metal core board.

Since the resin plate body 1 is spaced apart from the metal core board 2 by the predetermined distance H, heat can escape into a space between the metal core board 1 and the resin plate 2. This can secure the heat radiation from the metal core board 1.

Second Embodiment

Figure 4A:
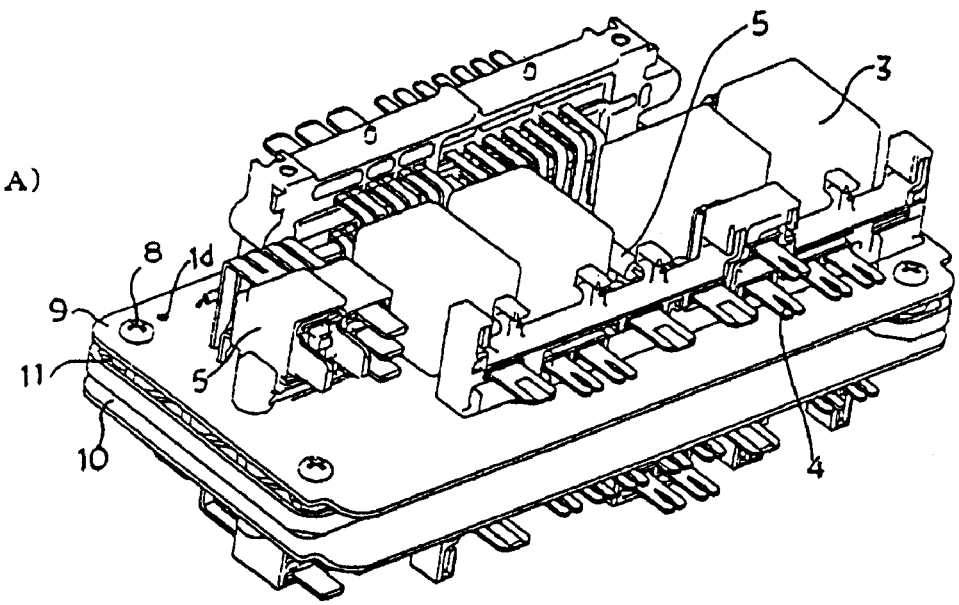
FIG. 4(A) is a perspective view showing a reinforcing structure for metal core board according to the second embodiment of the present invention.
Figure 4B:
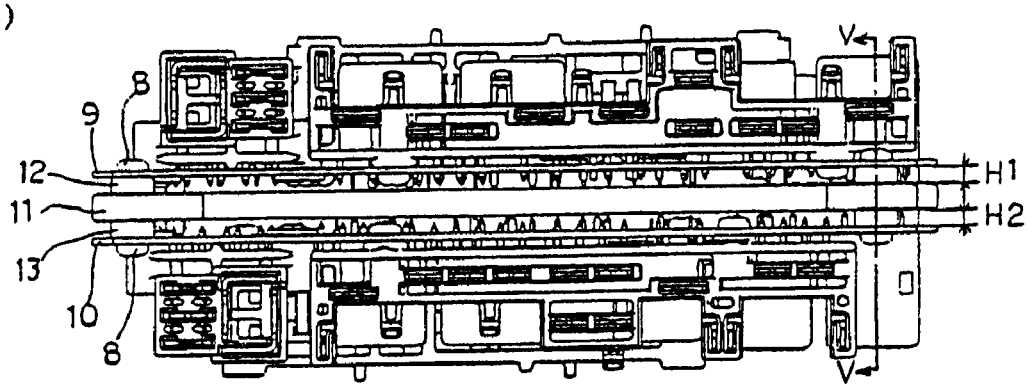
FIG. 4(B) is a side view of FIG. 4(A).
Figure 5:
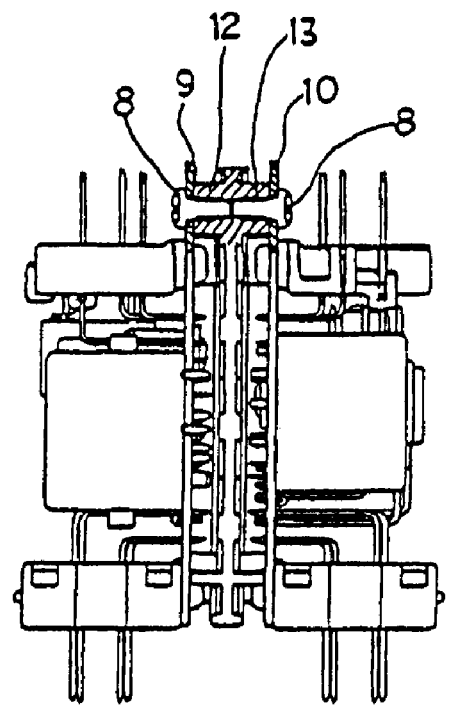
FIG. 5(A) is a cross-sectional view taken along a line V-V of the FIG. 4(B) and FIG. 5(B) is a schematic view of a bus bar used to connecting between the boards.
Figure 5:
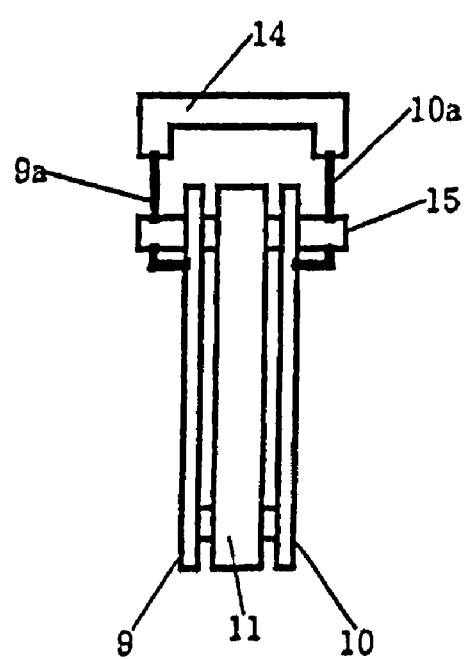

FIG. 4(A) is a perspective view showing a metal-core-board reinforcing structure according to the first embodiment of the present invention and FIG. 4(B) is a side view of FIG. 4(A). FIG. 5(A) is a cross-sectional view taken along a line V-V of the FIG. 4(B) and FIG. 5(B) is a schematic view illustrating a bus bar used to connect between the boards.

A metal-core-board reinforcing structure according to the second embodiment of the present invention comprises a first metal core board 9 including an internal metal core, a second metal core board 10 having a metal core and a resin plate 11 disposed between the first and second metal core boards 9, 10.

The first and second metal core boards 9, 10 and the resin plate 11 are substantially rectangular and have substantially the same surface area. The basic configuration of each of the first and second metal core boards 9, 10 and resin plate 11 is similar to that of the first embodiment and will not be further described.

The resin plate 11 includes four threaded stubs 12 formed therein at the four corners thereof and protruding from the resin plate 11 by a predetermined height. The threaded stubs 12 are used to fasten the resin plate 11 to the back side of the metal core board 9 through screws 8. The height of each of the first threaded stubs 12 is such selected that a predetermined first spacing H1 is provided between the resin plate 11 and the first metal core board 9 so that the back side of the resin plate 11 will not contact with the parts, solders and others on the back side of the first metal core board 9.

The resin plate 11 includes four threaded stubs 13 formed therein at the four corners thereof and protruding from the resin plate 2 by a predetermined height. The threaded stubs 13 are used to fasten the resin plate 11 to the back side of the metal core board 10 through screws 8. The height of each of the first threaded stubs 13 is such selected that a predetermined second spacing H2 is provided between the resin plate 11 and the second metal core board 10 so that the back side of the resin plate 11 will not contact with the parts, solders and others on the back side of the second metal core board 10.

As shown in FIG. 5(B), the first and second metal core boards 9, 10 are electrically connected to each other through a bus bar 14. A bus bar 14 is connected to the first connecting terminal 9a of the first metal core board 9 and also the second connecting terminal 10a of the second metal core board 10. The first and second connecting terminals 9a, 10a are supported by a terminal holder 15.

The reinforcing structure for the metal core board 1 according to the second embodiment of the present invention can prevent any short-circuiting between the boards since the resin plate 11 is interposed between the first and second metal core boards 9, 10.

Third Embodiment

Figure 6A:
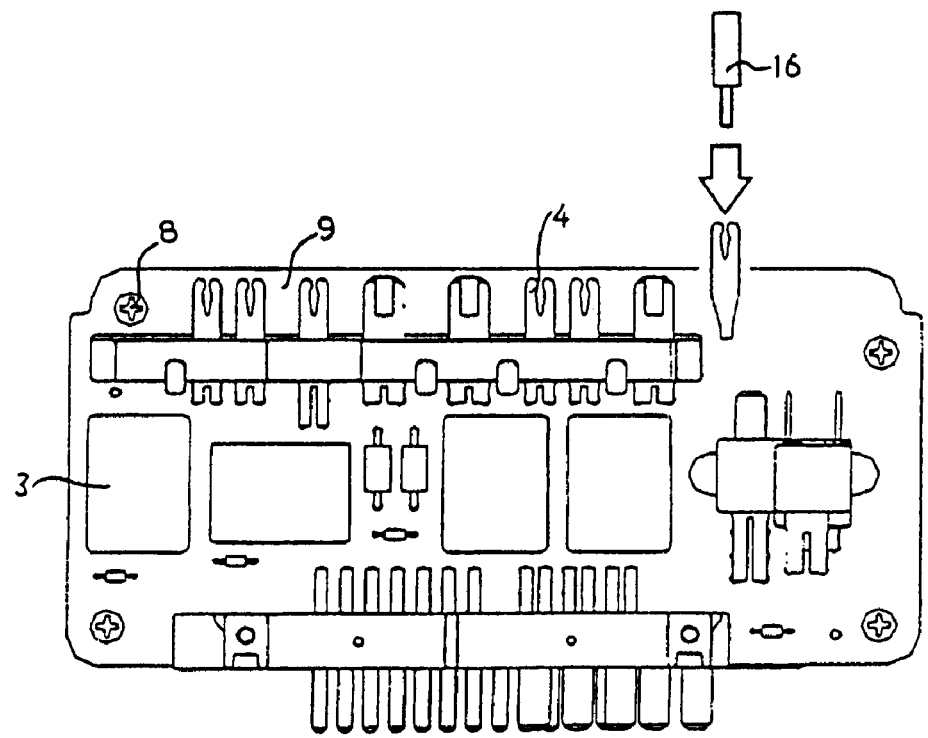
FIG. 6(A) is a plan view showing a reinforcing structure for metal core board according to the third embodiment of the present invention.
Figure 6B:
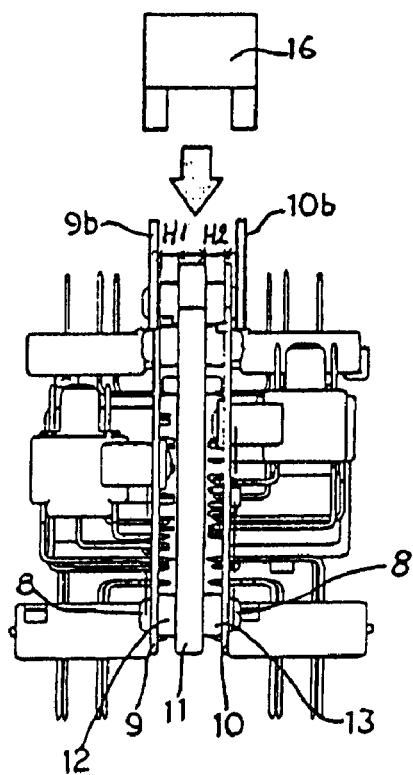
FIG. 6(B) is a front view of FIG. 6(A).

FIG. 6(A) is a plan view showing a metal-core-board reinforcing structure according to the third embodiment of the present invention and FIG. 6(B) is a front view of FIG. 6(A).

The reinforcing structure according to the third embodiment of the present invention is substantially similar to that of the second embodiment, but different therefrom only in that the first and second metal core boards 9, 10 are electrically connected to each other through a fuse 16.

Furthermore, the heights of the first and second threaded stubs 12, 13 are defined for the width of the fuse 16 to be connected thereto. Thus, the first distance H1 between the first metal core board 9 and the resin plate 11 as well as the second distance H2 between the second metal core board 10 and the resin plate 11 are defined.

According to the reinforcing structure for the metal core board 1 according to the third embodiment of the present invention, the technically standardized fuse 16 for connection between the boards can be used with any exclusive bus bar being unnecessary, by suitably defining the width of the resin plate 11 and the heights of the first and second threaded stubs 12, 13.

Fourth Embodiment

Figure 7A:
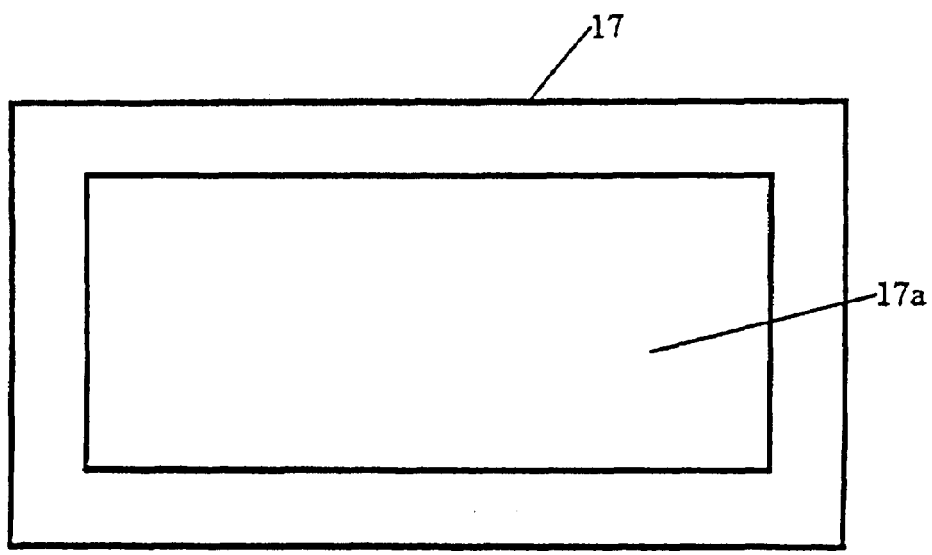
FIG. 7(A) is a plan view of a resin plate used in a reinforcing structure for metal core board according to the fourth embodiment of the present invention.
Figure 7B:
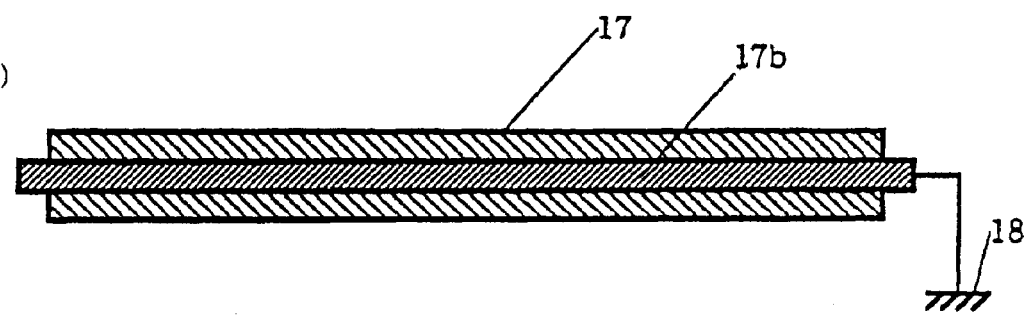
FIG. 7(B) is a cross-sectional view showing the internal structure of the resin plate used in the reinforcing structure for metal core board according to the fourth embodiment of the present invention.

FIG. 7(A) is a plan view of a resin plate used in a metal-core-board reinforcing structure according to the fourth embodiment of the present invention and FIG. 7(B) is a cross-sectional view showing the internal structure of the resin plate used in the reinforcing structure according to the fourth embodiment of the present invention.

The resin plate 17 used in the reinforcing structure according to the fourth embodiment of the present invention is characterized by an electromagnetic wave shielding function. In such an arrangement, the resin plate 17 can prevent any cross talk between the boards and reduce noise.

In order to provide the shielding function, an electromagnetic wave absorbing sheet 17a (e.g., "F-CO TM sheet", Product Grade EMI available from F-CO Co., Ltd.) may be applied to the surface of the resin plate 17, as shown in FIG. 7(A). Moreover, the resin plate 17 may be injection molded from a resin material in which a material of such a sheet is kneaded into a material of resin plate.

Furthermore, a metal braid provided by braiding metal wires such as copper into a mesh may be applied to the surface of the resin plate 17. Alternatively, a metal braid 17b may be used as a core for the resin plate 17 on injection molding, as shown in FIG. 7(B).

It the metal braid 17b is used, it is preferred that the metal braid 17b is grounded to a ground 18 (e.g., motorcar body) through a copper wire or the like.

It can be considered that the metal core board can be surrounded as a whole by a metal braid to provide the maximum shielding effect. It is preferred that the resin plate 17 has an electrostatic shield effect rather than surrounding the metal core board as in the embodiments of the present invention since the space-saving and weight reduction can be attained while providing the shielding effect.

Fifth Embodiment

Figure 8:
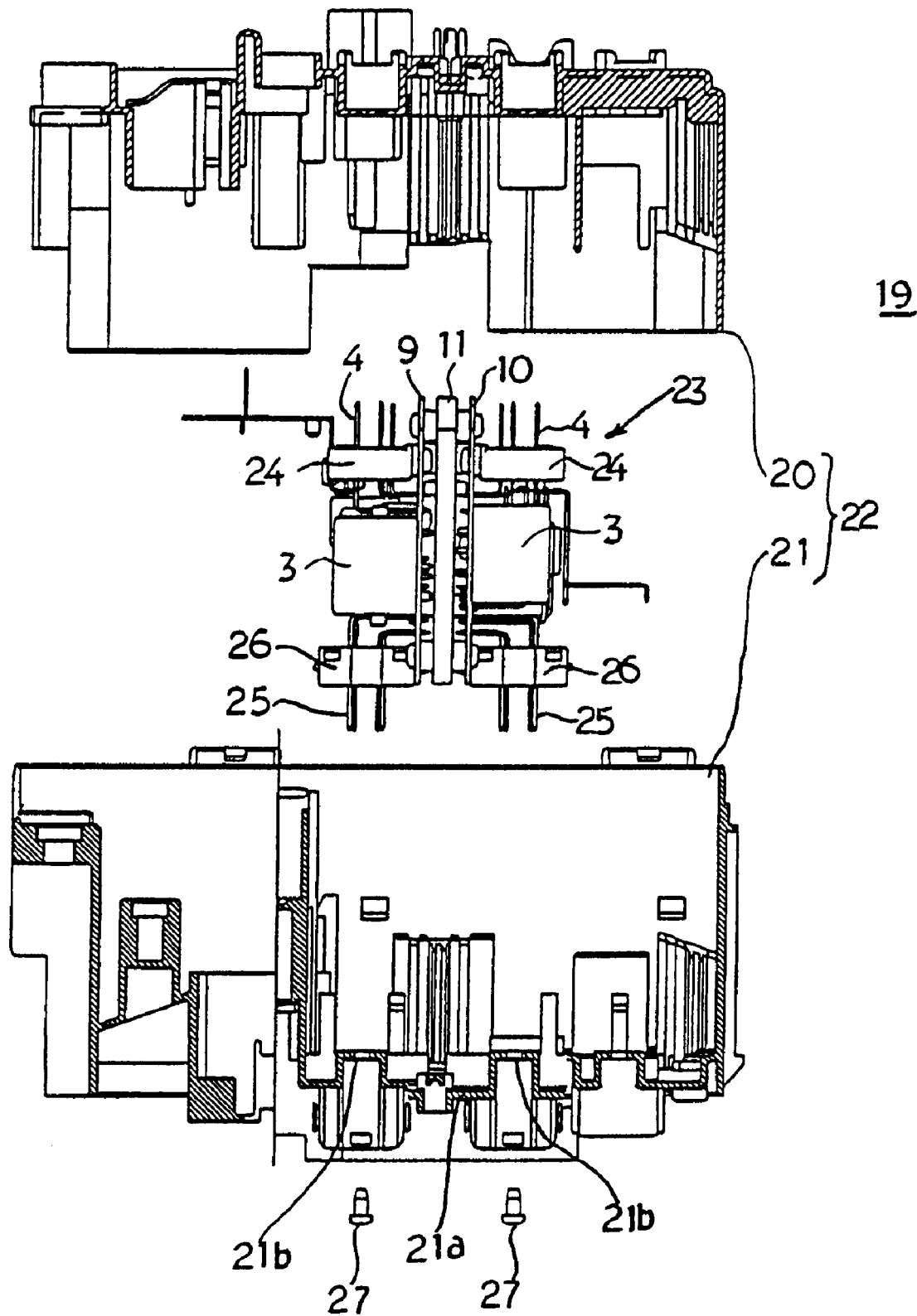
FIG. 8 is a cross-sectional view of an electric connection box according to the fifth embodiment of the present invention before assembled.
Figure 9A:
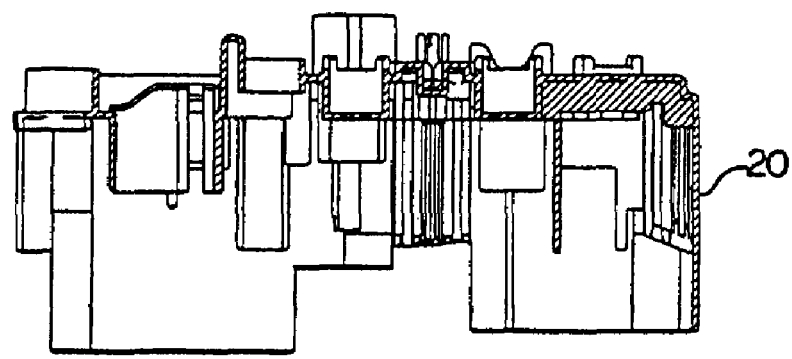
FIG. 9(A) is a cross-sectional view of a board assembly fixedly mounted on a lower casing portion.
Figure 9A:
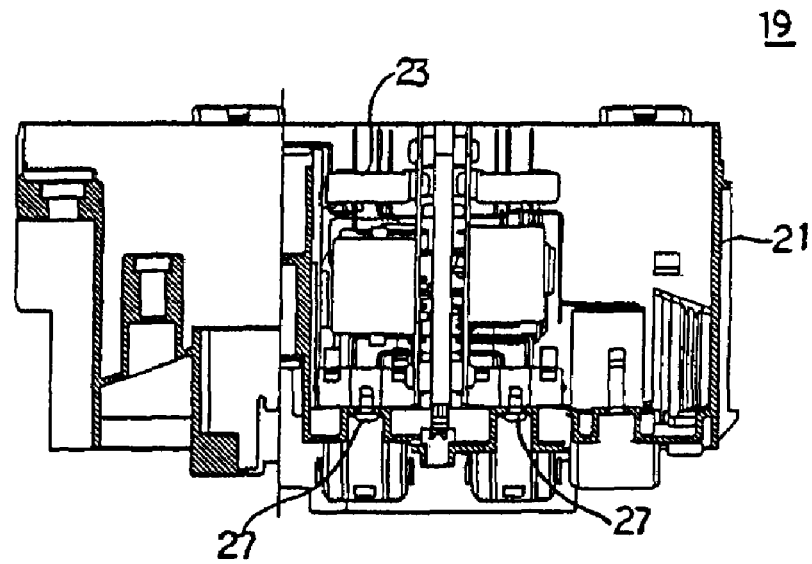
Figure 9B:
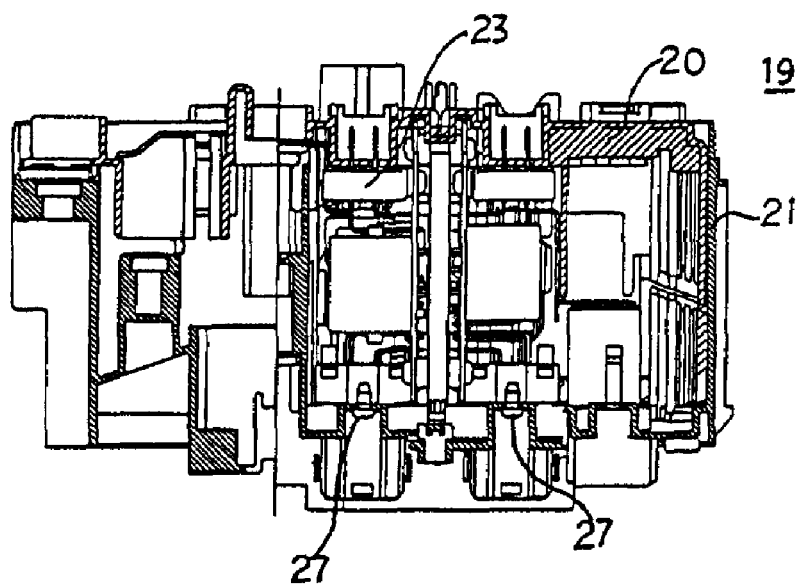
FIG. 9(B) is a cross-sectional view of upper and lower casing portions connected to each other.

FIG. 8 is a cross-sectional view of an electric connection box according to the fifth embodiment of the present invention before assembled. FIG. 9(A) is a cross-sectional view of a board assembly fixedly mounted on a lower casing portion and FIG. 9(B) is a cross-sectional view showing the upper and lower casing portions which have been connected to each other.

As shown in FIG. 8(A), an electric connection box 19 according to the fifth embodiment of the present invention is characterized that it comprises a casing 22 comprising upper and lower casing portions 20, 21 which are formed to extend in the horizontal direction, and a first board assembly 23 received in the casing 22 and having a reinforcing structure according to the second embodiment.

The first board assembly 23 includes a first metal core board 9 having an internal metal core, a second metal core board 10 having a metal core and a resin plate 11 disposed between the first and second metal core boards 9, 10.

The surface of each of the metal core boards 9 and 10 is provided with relays 3, fuse terminals 4, fuse terminal holders 24, connector terminals 25, connector terminal holders 26 and others.

The first board assembly 23 is fastened to the casing 22 inserts screw 27 into attachment bore 21b formed by mount 21a installed in lower casing portion 21, and it is coupled (cf. FIG. 9(A)), and disposed within the casing 22 substantially in the vertical direction (see FIG. 9(B)).

According to the electric connection box 19 according to the fifth embodiment of the present invention, the first board assembly 23 having the metal-core-board reinforcing structure is fixedly received by the casing 22. Thus, the strength of the metal core boards 9 and 10 can be secured. It is further possible to dispose the metal core boards 9 and 10 within the casing 22 substantially in the vertical position in addition to the horizontal position. As a result, the metal core boards 9 and 10 can be disposed within the casing 22 at any desired position. Furthermore, the desired number of metal core boards having the desired shape and size can be arranged within the casing 22. This enables the space of the casing 22 to be used more effectively.

Sixth Embodiment

Figure 10:
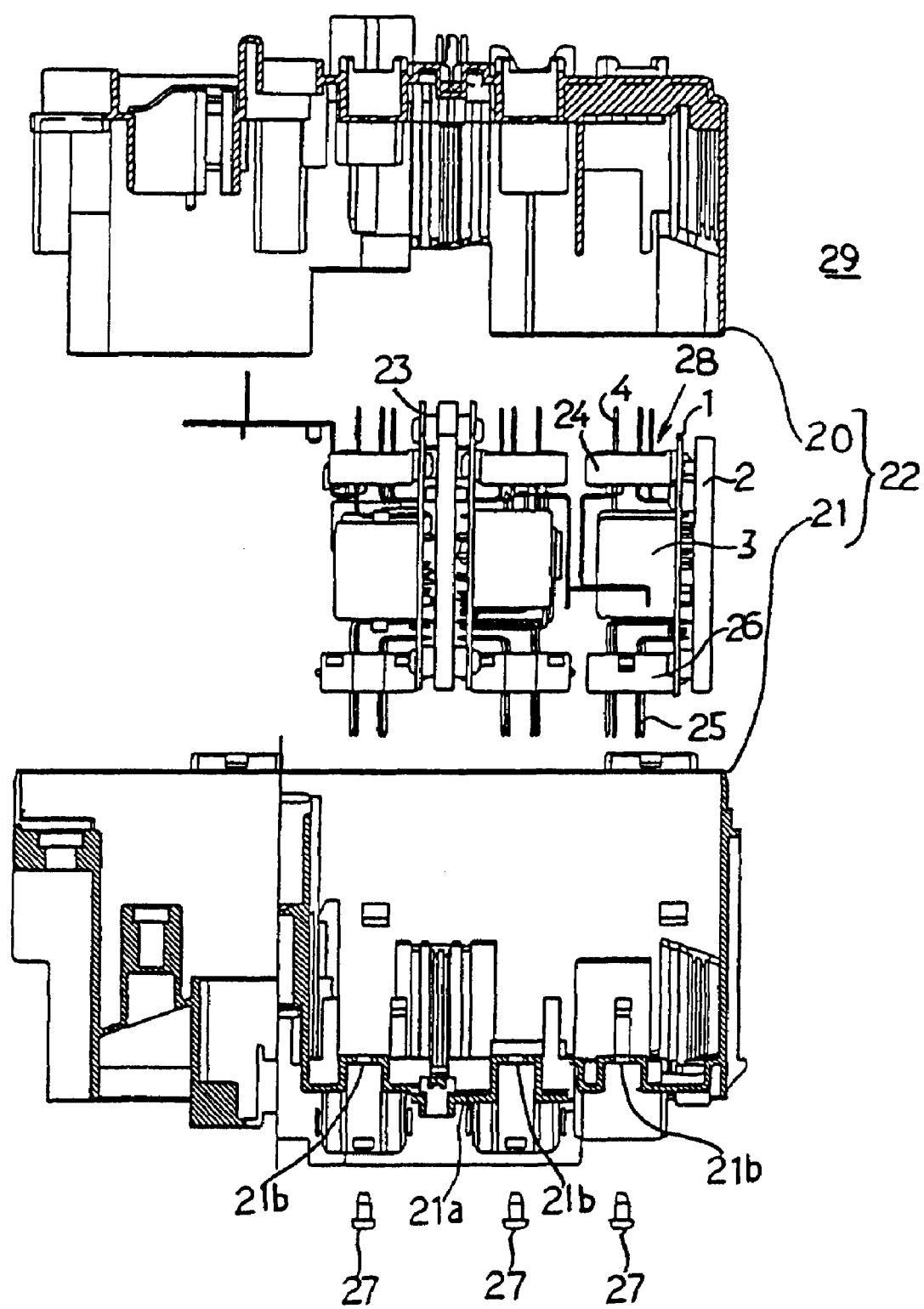
FIG. 10 is a cross-sectional view of an electric connection box according to the sixth embodiment of the present invention before assembled.
Figure 11A:
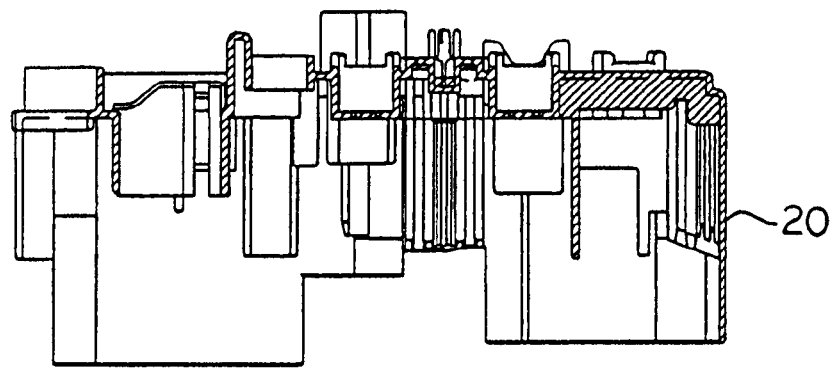
FIG. 11(A) is a cross-sectional view of a board assembly fixedly mounted on a lower casing portion.
Figure 11A:
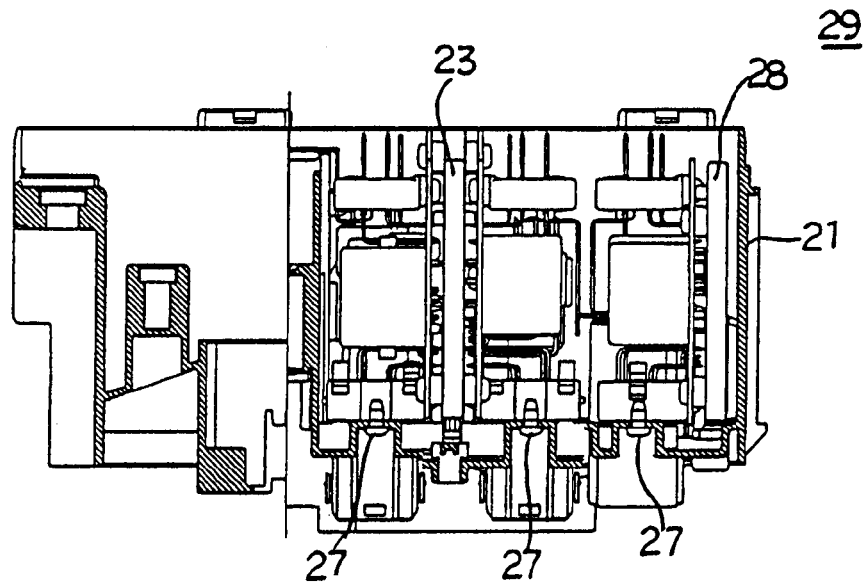
Figure 11B:
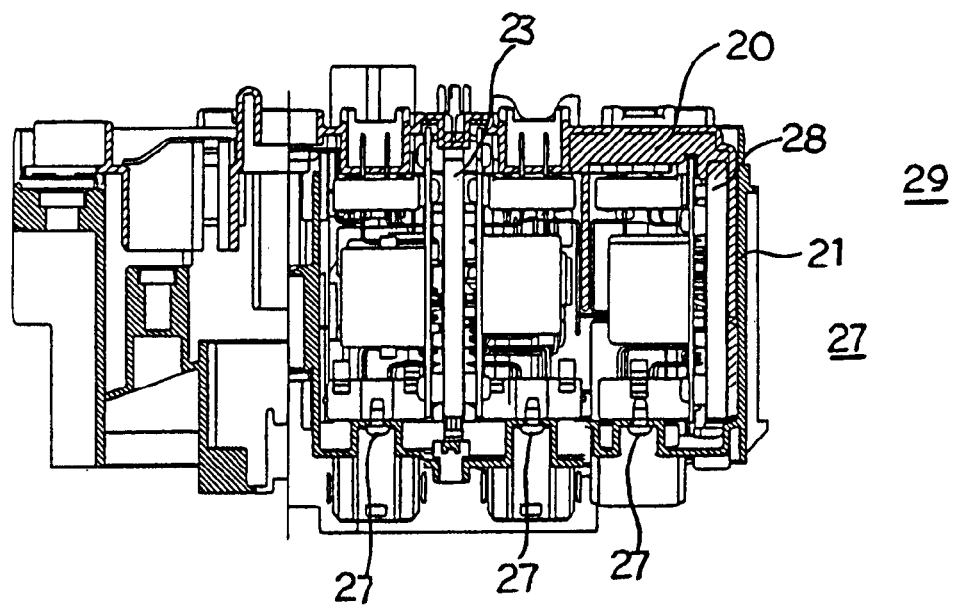
FIG. 11(B) is a cross-sectional view of upper and lower casing portion connected to each other.

FIG. 10 is a cross-sectional view showing an electric connection box according to the sixth embodiment of the present invention before assembled. FIG. 11(A) is a cross-sectional view of a board assembly fixedly mounted on a lower casing portion and FIG. 11(B) is a cross-sectional view showing upper and lower casing portions connected to each other. As shown in FIG. 10(A), the electric connection box 29 according to the sixth embodiment of the present invention is characterized by that the casing 22 also comprises a second board assembly 28 including the reinforcing structure according to the first embodiment in addition to the first board assembly 23.

The second board assembly 28 comprises a substantially rectangular metal core board 1 having an internal metal core, and a resin plate 2 having substantially the same extent as that of the metal core board 1, the resin plate 2 being fixedly attached to the metal core board 1 substantially parallel to the back side of the metal core board 1 and spaced apart therefrom by a predetermined distance.

The surface of the metal core board 1 is provided with relays 3, fuse terminals 4, fuse terminal holders 24, connector terminals 25, connector terminal holders 26 and others. The first and second board assemblies 23, 28 are fastened to the lower casing portion 21 by screwing screws 27 into amount holes 21b formed by mount 21a on the lower casing portion 21 (see FIG. 11(A)), and disposed within the casing 22 substantially in the vertical direction (see FIG. 11(B)).

According to the electric connection box 29 according to the sixth embodiment of the present invention, the first board assembly 23 having its larger width can be suitably combined with the second board assembly 28 having its smaller width so that they can be fixedly received by the casing 22. Thus, an increased number of metal core boards can be disposed within the casing 22.

The electric connection box of the present invention may include a single board assembly comprising a reinforcing structure according to any of the first to fourth embodiments or a suitable combination of board assemblies each comprising a reinforcing structure according to any of the first to fourth embodiments.

The present invention is not limited to the aforementioned embodiments, but may be applied in any of various modified forms without departing from the scope and sprit of the invention as defined in claims. For example, the shapes and materials of the metal core boards and resin plates are only exemplified as examples, but not limited to these matters.

According to the present invention, furthermore, it is preferred that the metal core board has substantially the same extent as that of the resin plate. However, there is no problem even though the metal core board is more or less different from the resin plate in shape or extent.

The present invention can be applied to motorcar electric connection box for the reinforcement of metal core boards used, for example.

The invention claimed is:

1. A metal-core-board reinforcing structure comprising:
a metal core board including first and second faces and a metal core; and a resin plate spaced apart from said metal core board in a first direction by a predetermined distance, the resin plate having substantially similar dimensions in each of second and third directions perpendicular to said first direction as dimensions of said metal core board in the second and third directions and fixedly attached to said metal core board substantially parallel to said second face of said metal core board;

wherein said second face of said metal core board faces said resin plate across an unobstructed space extending along a majority of the dimensions of the metal core board in the second and third directions.

2. The reinforcing structure according to claim 1, wherein said resin plate has an electromagnetic wave shielding function.

3. An electric connection box comprising:
a board assembly including a reinforcing structure according to claim 1; and
a casing fixedly receiving said board assembly.

4. The electric connection box according to claim 3, wherein said casing is formed to extend in the horizontal direction and said board assembly is disposed within said casing substantially in the vertical position.

5. The reinforcing structure according to claim 1, further including:
a metal braid connected to a surface of said resin plate.

6. A metal-core-board reinforcing structure comprising:
a first metal core board including first and second faces and a metal core;
a second metal core board including third and fourth faces and a metal core; and
a resin plate disposed between and spaced apart from said first metal core board in a first direction by a first predetermined distance, said first and second metal core boards and said resin plate having substantially the same dimensions in second and third directions perpendicular to said first direction, said resin plate being fixedly attached to said first metal core board substantially parallel to said second face of said first metal core board and also being fixedly attached to said second metal core board substantially parallel to said third face of said second metal core board;

wherein said second face of said first metal core board faces said resin plate across an unobstructed space extending along a majority of the dimensions of the first metal core board in the second and third directions.

7. The reinforcing structure according to claim 6, wherein said first and second metal core boards are electrically connected to each other through a fuse and said first and second distances are defined for the terminal width of said fuse.

8. The reinforcing structure according to claim 6, wherein said first and second metal core boards are electrically connected to each other through a bus bar and said first and second distances are defined for the terminal width of said bus bar.

9. A metal-core-board reinforcing structure comprising:
a first metal core board including a metal core;
a second metal core board including a metal core; and
a resin plate disposed between said first and second metal core boards, said first and second metal core boards and said resin plate having substantially the same dimensions, said resin plate being fixedly attached to said first metal core board substantially parallel to one side of said first metal core board and spaced apart therefrom by a first predetermined distance and also being fixedly attached to said second metal core board substantially parallel to one side of said second metal core board and spaced apart therefrom by a second predetermined distance;

wherein said first and second metal core boards are electrically connected to each other through a fuse and said first and second distances are defined for the terminal width of said fuse.

* * * * *